United States Patent
Zampaglione et al.

(10) Patent No.: US 8,416,633 B2
(45) Date of Patent: *Apr. 9, 2013

(54) SRAM LEAKAGE REDUCTION CIRCUIT

(75) Inventors: Michael Anthony Zampaglione, San Jose, CA (US); Michael Tooher, Mountain View, CA (US)

(73) Assignee: Mosaid Technologies Incorporated, Ottawa (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/291,360

(22) Filed: Nov. 8, 2011

(65) Prior Publication Data

US 2012/0057416 A1    Mar. 8, 2012

Related U.S. Application Data

(63) Continuation of application No. 12/705,345, filed on Feb. 12, 2010, now Pat. No. 8,077,527, which is a continuation of application No. 11/741,647, filed on Apr. 27, 2007, now Pat. No. 7,684, 262.

(60) Provisional application No. 60/796,138, filed on Apr. 28, 2006.

(51) Int. Cl.
*G11C 5/14* (2006.01)
(52) U.S. Cl. ............... 365/189.09; 365/154; 365/210.12
(58) Field of Classification Search ............ 365/185.16, 365/185.24, 154, 189.09, 210.12
See application file for complete search history.

(56) References Cited

U.S. PATENT DOCUMENTS

| | | | |
|---|---|---|---|
| 5,986,923 | A | 11/1999 | Zhang et al. |
| 6,222,780 | B1 | 4/2001 | Takahashi |
| 6,862,207 | B2 | 3/2005 | Wei et al. |
| 6,914,449 | B2 | 7/2005 | Kaviani |
| 6,977,519 | B2 | 12/2005 | Bhavnagarwala et al. |

FOREIGN PATENT DOCUMENTS

WO    2005057628    6/2005

OTHER PUBLICATIONS

PCT/US2007/067633, International Preliminary Report on Patentability and Written Opinion, 7 pages, Oct. 28, 2008.

(Continued)

*Primary Examiner* — Toan Le
(74) *Attorney, Agent, or Firm* — Dennis R. Haszko (57) ABSTRACT

A method and system are provided for maintaining a virtual ground node of an SRAM memory array at a minimum level sufficient for maintaining data retention. A circuit can maintain the virtual ground node at a virtual ground reference voltage of $V_{DD}-(1.5*V_{th})$, or maintain $1.5*V_{th}$ across the memory cells, where $V_{th}$ is a threshold voltage of an SRAM memory cell transistor and $V_{DD}$ is a positive supply voltage. By tracking the $V_{th}$ of the memory cell transistors in the SRAM array, the circuit reduces leakage current while maintaining data integrity. A threshold voltage reference circuit can include one or more memory cell transistors (in parallel), or a specially wired memory cell to track the memory cell transistor threshold voltage. The value of the virtual ground reference voltage can be based on a ratio of feedback chain elements in a multiplier circuit.

18 Claims, 5 Drawing Sheets

U.S. PATENT DOCUMENTS

| | | |
|---|---|---|
| 6,999,338 B1 | 2/2006 | Hirabayashi |
| 7,099,230 B1 | 8/2006 | Tran |
| 7,684,262 B2 * | 3/2010 | Zampaglione et al. .. 365/189.09 |
| 8,077,527 B2 * | 12/2011 | Zampaglione et al. .. 365/189.09 |
| 2004/0071010 A1 | 4/2004 | Wei et al. |
| 2005/0018518 A1 | 1/2005 | Bhavnagarwala et al. |
| 2005/0135162 A1 | 6/2005 | Somasekhar et al. |
| 2005/0157537 A1 | 7/2005 | Wei et al. |
| 2006/0044865 A1 | 3/2006 | Hirabayashi |
| 2006/0050590 A1 | 3/2006 | Nautiyal et al. |
| 2006/0291296 A1 | 12/2006 | Tran |

OTHER PUBLICATIONS

Roy et al., "Leakage Current Mechanisms and Leakage Reduction Techniques in Deep-Submicromenter CMOS Circuits", Proceedings of the IEEE, vol. 91, No. 2, Feb. 2003, pp. 305-327.

Piguet, "Low voltage integrated circuits—Design and construction", Low-Power Electronics Design, 2005 CRC Press LLC, pp. 18-6, 18-9.

Tschanz et al., "Dynamic Sleep Transistor and Body Bias for Active Leakage Power Control of Microprocessors," IEEE Journal of Solid-State Circuits, vol. 38, No. 11, Nov. 2003, pp. 1838 to 1845, IEEE, Piscataway, NJ.

* cited by examiner

SRAM LEAKAGE REDUCTION CIRCUIT

CROSS REFERENCE TO RELATED APPLICATIONS

This application is a continuation of U.S. patent application Ser. No. 12/705,345, filed on Feb. 12, 2010, which is a continuation of U.S. patent application Ser. No. 11/741,647 filed on Apr. 27, 2007, now U.S. Pat. No. 7,684,262, which claims the benefit of priority of U.S. Provisional Patent Application No. 60/796,138 filed Apr. 28, 2006, which is incorporated herein by reference.

BACKGROUND

In the design of integrated circuits, such as memory circuits, power consumption is an issue that receives much attention. In a memory circuit, a memory array typically includes a plurality of memory cells. With reduced physical size of integrated circuit components in submicron technologies, and the desire to reduce operating power, transistors with a reduced threshold voltage are used in memory cells. Consequently, leakage current becomes a dominant portion of static power consumption.

In power conscious applications it is sometimes desirable to reduce the standby leakage current of a random access memory, such as SRAM. This can be done by turning off power to the SRAM. However, this will cause the SRAM to lose the data stored in it. SRAM is a type of semiconductor memory that retains its contents as long as power remains applied. Therefore, in low power consumption operating modes, such as standby, the SRAM data must be retained while minimizing the power consumption due to leakage.

Some known solutions address the reduction of leakage currents. Transistor stacks, also known as self-reverse bias, use a technique that gives a large reduction in leakage current, but requires a large area increase in the memory cell. Simple gated-ground, or virtual ground, techniques have poor control over the voltage on the virtual ground node. A dynamic threshold voltage technique, also known as body biasing, requires a more complicated fabrication process known as a triple well process.

Prior solutions appear to have had very poor control over the virtual ground voltage, so the reliability of data retention was not quantifiable. Most solutions did not have any mechanism for limiting the virtual ground voltage based on any circuit parameter that could affect the stability of the memory cells.

It is, therefore, desirable to provide an approach that reduces leakage current while maintaining data integrity, without a significant burden in complexity or cost.

SUMMARY

In a first example embodiment, a system is provided for maintaining a virtual ground node of an SRAM array at a data retention level. The system includes a threshold reference voltage generation circuit to generate a threshold reference voltage. The threshold reference voltage is based on a threshold voltage of a memory cell transistor in the SRAM array. A multiplier circuit is coupled to the threshold reference voltage generation circuit to receive the threshold reference voltage and output a virtual ground reference voltage. The virtual ground reference voltage is equal to a difference between the positive supply voltage and a product of a multiplication factor and the threshold voltage of the memory cell transistor. A virtual ground leakage reduction circuit is coupled to the multiplier circuit to receive the virtual ground reference voltage and maintain a virtual ground node coupled to the SRAM array at the virtual ground reference voltage.

The threshold reference voltage generation circuit can include a voltage divider. The voltage divider can include: a threshold reference voltage node; a threshold voltage tracking means coupled to the threshold reference voltage node to track the threshold voltage of the memory cell transistor in the SRAM array; and a current discharge means coupled to the threshold reference voltage node.

The threshold voltage tracking means can be coupled between the positive supply voltage and the threshold reference voltage node, and the current discharge means is coupled between the threshold reference voltage node and a negative supply voltage. The threshold voltage tracking means can include a reference transistor having substantially identical characteristics to the memory cell transistor in the SRAM array. The reference transistor can comprise an n-channel transistor, which can have its gate and drain coupled to the positive supply voltage, and its source coupled to the current discharge means.

The threshold voltage tracking means can comprise a plurality of reference transistors connected in parallel. In that case, each of the plurality of reference transistors has substantially identical characteristics to the memory cell transistor in the SRAM array.

The threshold voltage tracking means can comprise a modified SRAM memory cell. The modified SRAM memory cell can comprise a six-transistor cross coupled CMOS cell including first and second memory cell transistors. The first memory cell transistor can have its gate and its drain coupled to the positive supply voltage. The second memory cell transistor can have its drain connected to the positive supply voltage. The source terminals of the first and second memory cell transistors can be coupled to the threshold reference voltage node.

The current discharge means can include a resistor, or a current source.

The current discharge means can be coupled between the positive supply voltage and the threshold reference voltage node, and the threshold voltage tracking means can be coupled between the threshold reference voltage node and a negative supply voltage. In that case, the threshold voltage tracking means can include a reference transistor having substantially identical characteristics to the memory cell transistor in the SRAM array. The reference transistor can include an n-channel transistor having its gate and drain coupled to the current discharge means, and its source coupled to the negative supply voltage. The current discharge means can include a resistor, or a current source.

In an embodiment, the virtual ground reference voltage is equal to a difference between the positive supply voltage and a product of a multiplication factor and the threshold voltage of the memory cell transistor. The multiplier circuit can include a feedback path circuit including a first feedback chain element and a second feedback chain element, the multiplication factor being based on a ratio of the first feedback chain element to the second feedback chain element. For example, the multiplying factor can be about 1.5 when the ratio is about 2:1.

The multiplier circuit can include an operational amplifier having its inverting input coupled to the output of the threshold reference voltage circuit and its non-inverting input coupled to the first feedback chain element and the second feedback chain element. The multiplier circuit can also include a multiplier circuit transistor having its source coupled to a negative supply voltage and its gate coupled to the output of the operational amplifier and its drain coupled to the second feedback chain element, such that the second feedback chain element is coupled between the drain of the multiplier circuit and the non-inverting input of the operational amplifier. The first feedback chain element can be coupled between the non-inverting input of the operational amplifier and the positive supply voltage. In an embodiment, the first and second feedback chain elements are first and second resistors.

The leakage reduction circuit can include: a leakage reduction transistor having its source coupled to a negative supply voltage; and an operational amplifier having its non-inverting input coupled to the drain of the leakage reduction transistor and its output coupled to the gate of the leakage reduction transistor. The inverting input of the operational amplifier can be coupled to the virtual ground reference voltage.

The active mode circuit can include an active mode transistor to connect the virtual ground node to a negative supply voltage in response to an active signal.

In another example embodiment, a system is provided for maintaining a virtual ground node of a static random access memory (SRAM) array at a data retention level, comprising: a threshold reference voltage generation circuit to generate a threshold reference voltage, the threshold reference voltage being based on a threshold voltage of a memory cell transistor in the SRAM array; and a multiplier circuit coupled to the threshold reference voltage generation circuit to receive the threshold reference voltage and output a virtual ground reference voltage equal to a difference between the positive supply voltage and a product of a multiplication factor and the threshold voltage of the memory cell transistor, and to maintain a virtual ground node coupled to the SRAM array at the virtual ground reference voltage. The multiplier circuit can include a multiplier operational amplifier having an output drive sufficient to maintain the virtual ground node coupled to the SRAM array at the virtual ground reference voltage.

In a further example embodiment, a method is provided of maintaining a virtual ground node of an SRAM array at a data retention level, including the following steps: tracking a threshold voltage of a memory cell transistor in the SRAM array; outputting a virtual ground reference voltage to a difference between a positive supply voltage and a product of a multiplication factor and the threshold voltage of the memory cell transistor; and maintaining the virtual ground node of the SRAM array at the virtual ground reference voltage.

The step of outputting the virtual ground reference voltage can include generating a threshold reference voltage, the threshold reference voltage being a function of the threshold voltage of the memory cell transistor in the SRAM array. The virtual ground reference voltage can be equal to a difference between the positive supply voltage and about one and a half times the threshold voltage of the memory cell transistor.

In a yet further example embodiment, a threshold reference voltage generation circuit is provided for an SRAM array, including a voltage divider coupled between a positive supply voltage and a negative supply voltage to generate a threshold reference voltage. The threshold reference voltage is substantially equal to a difference between the positive supply voltage and the threshold voltage of the memory cell transistor in the SRAM array.

The voltage divider can include: a threshold reference voltage node; a threshold voltage tracking means coupled to the threshold reference voltage node to track a threshold voltage of the memory cell transistor in the SRAM array, and a current discharge means coupled to the threshold reference voltage node. The threshold voltage tracking means can include an n-channel reference transistor having substantially identical characteristics to the memory cell transistor in the SRAM array. The threshold voltage tracking means can include a plurality of n-channel transistors connected in parallel, each of the plurality of reference transistors having substantially identical characteristics to the memory cell transistor in the SRAM array. The threshold voltage tracking means can include a six-transistor cross coupled CMOS SRAM memory cell including first and second memory cell transistors. The first memory cell transistor can have its gate and its drain coupled to the positive supply voltage; the second memory cell transistor can have its drain connected to the positive supply voltage; and the source terminals of the first and second memory cell transistors can be coupled to the threshold reference voltage node.

In an implementation, the present disclosure provides a system for maintaining a virtual ground node of an SRAM array at a data retention level, including: a multiplier circuit arranged to receive a generated threshold reference voltage and to output a virtual ground reference voltage equal to a difference between the positive supply voltage and a product of a multiplication factor and a threshold voltage of a memory cell transistor in the SRAM array; and a virtual ground leakage reduction circuit coupled to the multiplier circuit to receive the virtual ground reference voltage and maintain a virtual ground node coupled to the SRAM array at the virtual ground reference voltage.

In another implementation, the present disclosure provides a threshold reference voltage generation circuit for an SRAM array, including: a voltage divider coupled between a positive supply voltage and a negative supply voltage to generate a threshold reference voltage, the threshold reference voltage being substantially equal to a difference between the positive supply voltage and the threshold voltage of a memory cell transistor in the SRAM array.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments will now be described, by way of example only, with reference to the attached Figures, wherein.

DETAILED DESCRIPTION

Generally, embodiments of the present disclosure provide a method and system for maintaining a virtual ground node of an SRAM memory array at a minimum level sufficient for maintaining data retention. A circuit can maintain the virtual ground node at a virtual ground reference voltage of $V_{DD}$-

($1.5*V_{th}$), or maintain $1.5*V_{th}$ across the memory cells, where $V_{th}$ is a threshold voltage of an SRAM memory cell transistor and $V_{DD}$ is a positive supply voltage. By tracking the $V_{th}$ of the memory cell transistors in the SRAM array, the circuit reduces leakage current while maintaining data integrity. A threshold voltage reference circuit can include one or more memory cell transistors (in parallel), or a specially wired memory cell to track the memory cell transistor threshold voltage. The value of the virtual ground reference voltage can be based on a ratio of feedback chain elements in a multiplier circuit.

The terms "transistor threshold voltage" and "threshold voltage", $V_{th}$, are used herein to represent a gate voltage or cutoff voltage necessary to transition a transistor from "off" to "on", or vice versa.

The term "memory cell" is used herein to represent a cell, or corecell, in a memory array. For example, in an SRAM array, a memory cell is an SRAM cell.

The term "data retention level" is used herein to represent a voltage level, for example a minimum voltage level, sufficient for maintaining data retention in an SRAM. A multiplication factor can be used to ensure that the voltage level provided to the SRAM meets the desired data retention level. For example, a multiplication factor of not greater than about 1.5 can be used to generate a virtual ground reference voltage that maintains the state/data in the memory while reducing leakage current. A multiplication factor of less than about 1.5 can result in a higher virtual ground reference voltage, which will also retain the data exceed the level required for maintaining data retention.

Leakage current in CMOS circuits can be defined as the drain current when the gate-source voltage difference is less than the threshold voltage. Leakage current typically includes two main sources: reverse bias diode currents, which are due to stored charge between the drain and bulk of active transistors; and sub-threshold currents, which are due to carrier diffusion between the source and drain of the off transistors.

It has been theorized that an SRAM memory cell will maintain its state if a voltage ≧1.5 times the cell transistor threshold voltage $V_{th}$ is applied across the cell. The value of 1.5 represents a value of the multiplication factor discussed earlier. Embodiments of the present disclosure include a circuit for generating a reference voltage that is used to keep $1.5*V_{th}$ across the memory array by regulating the source voltage of the memory cells. The circuit is used in conjunction with a virtual ground memory architecture, and uses a reference circuit to track the $V_{th}$ of a memory cell transistor.

Some known approaches minimize leakage current in a digital manner. Such approaches assign a virtual ground voltage to be the difference between a positive supply voltage, $V_{DD}$, and a threshold voltage of a p-channel transistor. However, this is a digital signal that turns portions of a circuit on or off. According to embodiments of the present disclosure, circuit elements combine to produce an analog voltage as a virtual ground voltage that is a function of a threshold voltage of a memory cell transistor within the SRAM array. In an embodiment, the virtual ground voltage is equal to a difference between a positive supply voltage and 1.5 times a threshold voltage of a memory cell transistor within the SRAM array.

Figure 1:
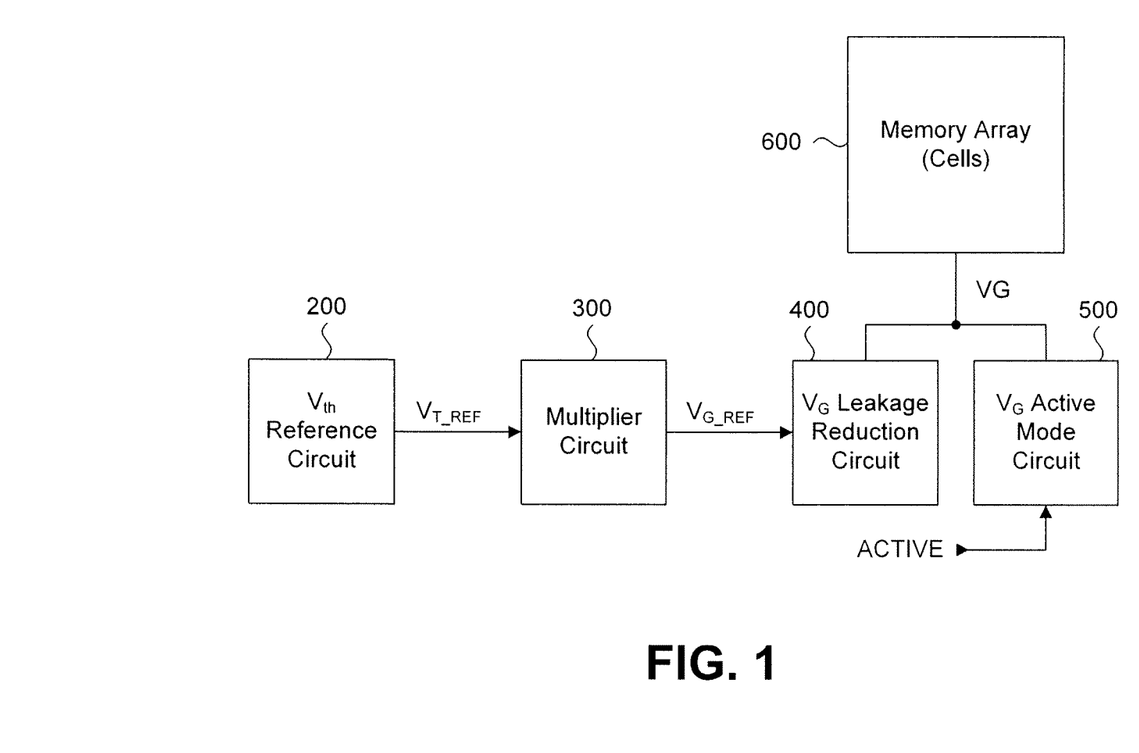
FIG. 1 is a block diagram representing an embodiment of the present disclosure.

FIG. 1 is a block diagram representing an embodiment of the disclosure. The circuit blocks in FIG. 1 cooperate to reduce the memory leakage current by reducing the voltage across the memory cells while still retaining the stored data. The circuitry controls the virtual ground node VG based on a memory transistor threshold voltage in order to safely keep the memory cell data under all process conditions. It is worth noting that VG is used herein to represent a node, and does not represent a voltage. The circuitry uses the threshold voltage, $V_{th}$, of a memory cell transistor to generate a reference voltage. The reference voltage is used to keep a virtual ground reference voltage $V_{G\_REF}$ of, for example, 1.5 times $V_{th}$ across the memory array. This can be achieved by regulating the virtual ground reference voltage (i.e. the source voltage) at the virtual ground node VG of the memory cells.

The circuitry in FIG. 1 includes virtual ground circuitry. Virtual ground circuitry is any circuitry configured to generate a virtual ground voltage and to control a virtual ground node of the memory circuitry. As shown in FIG. 1, one example of an embodiment of virtual ground circuitry includes: a threshold voltage reference circuit 200; a multiplier circuit 300; a virtual ground leakage reduction circuit 400; and a virtual ground active mode circuit 500. In an embodiment to be described later in relation to FIG. 3, the multiplier circuit 300 includes suitable circuitry to avoid the need for the virtual ground leakage reduction circuit 400. The virtual ground leakage reduction circuit 400 and the virtual ground active mode circuit 500 can be regarded as a voltage follower circuit. A memory array 600 is also shown in FIG. 1.

The threshold voltage reference circuit 200 generates a reference threshold voltage $V_{T\_REF}$ that is a function of a threshold voltage of a memory cell transistor in the memory array. In an embodiment, the reference threshold voltage equals $V_{DD}-V_{th}$, where $V_{DD}$ is a positive supply voltage and $V_{th}$ is a threshold voltage of a memory cell transistor in the memory array. The reference threshold voltage $V_{T\_REF}$ is received by the multiplier circuit 300. The multiplier circuit 300 provides a multiplication factor to $V_{T\_REF}$, and outputs a voltage $V_{G\_REF}$. The VG leakage reduction circuit 400 receives $V_{G\_REF}$ to maintain the virtual ground node (VG) of the memory array 600 at the same voltage as $V_{G\_REF}$ ($V_{DD}-(1.5*V_{th})$). It is noted that node VG is pulled up by the leakage current in the memory cells of the memory array 600. The aforementioned circuits can operate during a low power consumption mode, such as standby, to reduce power consumption due to leakage. In an active mode of operation, VG Active mode circuit 500 is turned on in response to signal ACTIVE to connect node VG to $V_{SS}$, where $V_{SS}$ is a negative supply voltage.

Figure 2:
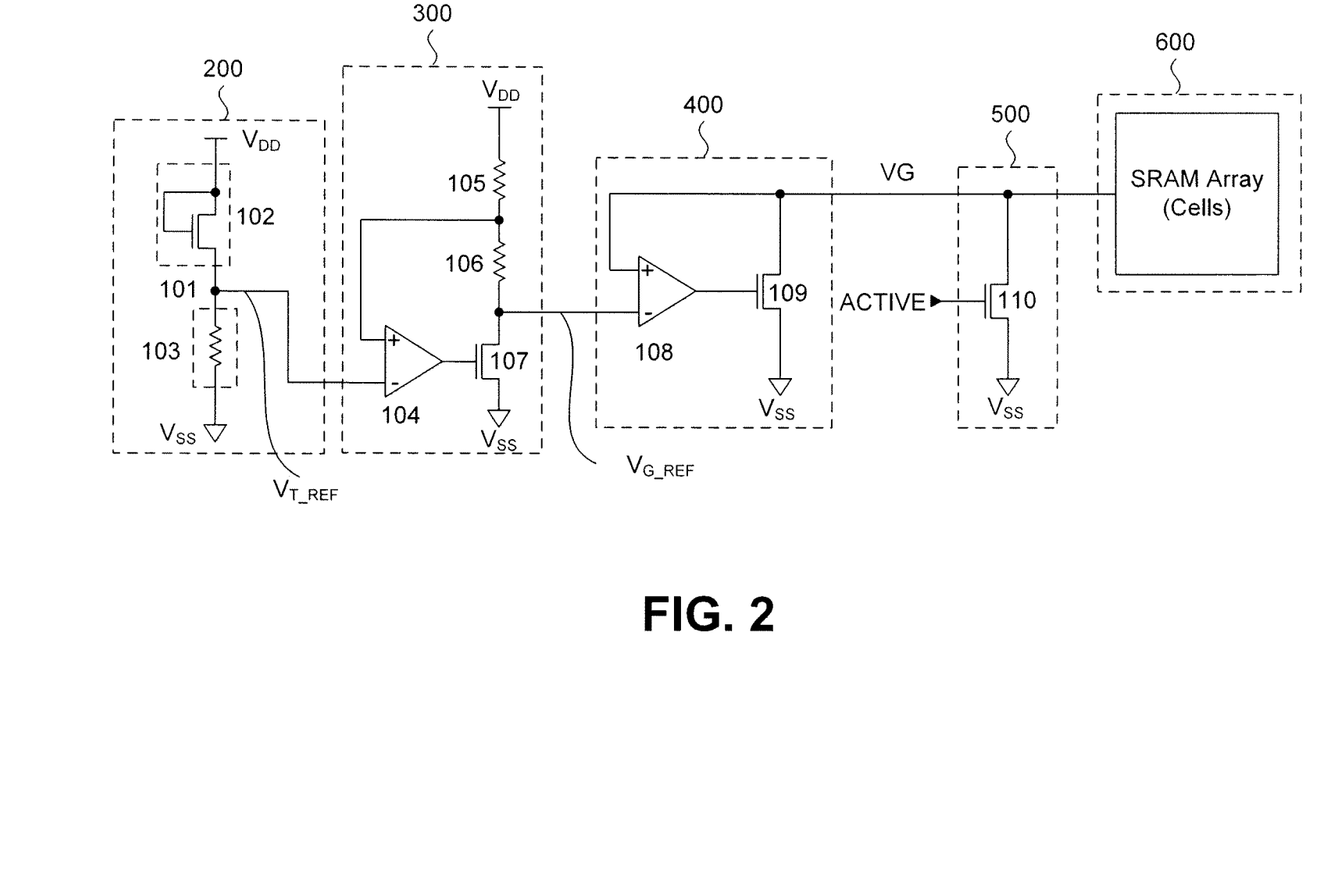
FIG. 2 is a circuit diagram for certain blocks of FIG. 1.

FIG. 2 shows circuit diagram embodiments for blocks 200, 300, 400 and 500 shown in FIG. 1. In the example of FIG. 2, the memory is a CMOS SRAM. In the embodiment of FIG. 2, the threshold voltage reference circuit 200 includes a voltage divider coupled between a positive supply voltage $V_{DD}$ and a negative supply voltage $V_{SS}$. The voltage divider generates a threshold reference voltage $V_{T\_REF}$, which is based on, or is a function of, the threshold voltage ($V_{th}$) of a memory cell transistor in the SRAM array. The voltage divider can include, or define, a threshold reference voltage node 101. In this embodiment, a threshold voltage tracking means 102 is coupled to the threshold reference voltage node 101 to track the threshold voltage of the memory cell transistor in the SRAM array. The embodiment also includes a current discharge means 103 coupled to the threshold reference voltage node 101. The current discharge means 103 allows a minimal amount of current to flow toward the threshold reference voltage node 101 in order to activate the threshold voltage tracking means 102.

In the embodiment of FIG. 2, the threshold voltage tracking means 102 is coupled between the positive supply voltage and the threshold reference voltage node 101, and the current discharge means 103 is coupled between the threshold reference voltage node and the negative supply voltage. The threshold voltage tracking means 102 can comprise a transistor having substantially identical characteristics to a memory cell transistor in the SRAM array. The transistor can be an n-channel transistor. As shown in FIG. 2, the current discharge means 103 can comprise a resistor. In an embodiment, the resistance of the resistor is just high enough to let just enough current through to turn on the transistor with a minimum amount of current going through.

In an exemplary embodiment where the threshold voltage tracking means 102 is a transistor and the current discharge means 103 is a resistor, the transistor can be referred to as a reference transistor and the resistor can be referred to as a load resistor. In this embodiment, the reference transistor 102 has its drain and gate tied to $V_{DD}$ and its source tied to the load resistor 103. A small current through the resistor 103 is sufficient to turn on the reference transistor 102. This will produce a $V_{DS}$ (drain-source voltage) close to the Vth of the transistor. In this embodiment, reference transistor 102 is an n-channel transistor that has substantially identical characteristics to the n-channel transistors used in the memory cells of SRAM 600. As the reference voltage $V_{T\_REF}$ ($V_{DD}-V_{th}$) rises, the $V_{th}$ of transistor 102 will rise due to the body effect. This tracks the Vth change of the memory cell transistors when the voltage at the virtual ground node rises to $V_{DD}-(1.5*V_{th})$.

In another embodiment, the threshold voltage tracking means 102 can comprise a plurality of transistors connected in parallel, each of the plurality of transistors having substantially identical characteristics to a memory cell transistor in the SRAM array. The use of a plurality of transistors tied in parallel can reduce variation in the reference voltage which can be caused by the process variation of only one transistor.

Returning to FIG. 2, the multiplier circuit 300 can comprise any combination of circuit elements that provide a desired multiplication factor. Generally, if an input voltage $V_{IN}=V_{DD}-V_{th}$, then the multiplier circuit 300 has an output voltage $V_{OUT}=V_{DD}-(M*V_{th})$, where M is the desired multiplication factor. The multiplier circuit 300 in the embodiment of FIG. 2 includes an operational amplifier 104 and a feedback path circuit to provide the desired multiplication factor. The feedback path circuit can include a plurality of feedback chain elements. The desired multiplication factor can be based on a ratio of a first feedback chain element 105 to a second feedback chain element 106. In an exemplary embodiment, a ratio of a first feedback chain element 105 to the second feedback chain element 106 of 2:1 results in a multiplication factor of 1.5.

In an embodiment, the feedback path circuit includes a multiplier transistor 107 and the first and second feedback chain elements 105 and 106 comprise first and second resistors, respectively. The first resistor 105 and second resistor 106 can be described as a resistor divider. In this embodiment, the first resistor 105 is coupled between the supply voltage and the non-inverting input of the operational amplifier 104. The second resistor 106 is coupled between the non-inverting input of the operational amplifier 104 and the drain of the multiplier transistor 107. The inverting input of the operational amplifier 104 is coupled to the output of the threshold reference voltage circuit. The gate of the multiplier transistor is coupled to the output of the operational amplifier. The source of the multiplier transistor is coupled to the negative supply voltage.

In this exemplary embodiment, the multiplication factor of 1.5 is based on the ratio of the first resistor 105 to the second resistor 106. If the resistance of the first resistor 105 is represented by $R_1$ and the resistance of the second resistor 106 is represented by $R_2$, a ratio of $R_1/R_2$ of about 2:1 will result in a multiplication factor of about 1.5 Using such a resistor divider, if the input voltage $V_{T\_REF}$ is $V_{DD}-V_{th}$, then the output voltage $V_{G\_REF}$ is $V_{DD}-(1.5*V_{th})$. In this embodiment, the "virtual ground" of the memory array is allowed to increase to $V_{DD}-(1.5*V_{th})$ so there is always at least $1.5*V_{th}$ across the memory cells.

The VG leakage reduction circuit 400 in FIG. 2 includes operational amplifier 108 and leakage reduction transistor 109. The leakage reduction transistor 109 has its drain coupled to VG, its gate coupled to the output of the operational amplifier 108, and its source coupled to $V_{SS}$. This circuit forces the virtual ground node VG to $V_{G\_REF}$ via the output of operation amplifier 108 on the gate of transistor 109. In other words, the voltage follower forces the virtual ground node of the memory array to be the same voltage as the output of the multiplier circuit leaving transistor 109, ($V_{DD}-(1.5*V_{th})$), thus obtaining a desired result of having $1.5*V_{th}$ across the memory array. The VG leakage reduction circuit 400 can act as a voltage regulator.

The VG Active mode circuit 500 includes an active mode transistor 110 for driving node VG to voltage $V_{SS}$ in response to signal ACTIVE. The active mode transistor 110 is turned off during standby mode. When the RAM is in the normal active mode, transistor 109 is turned off and transistor 110 is turned on to control the virtual ground node of the memory array.

Figure 3:
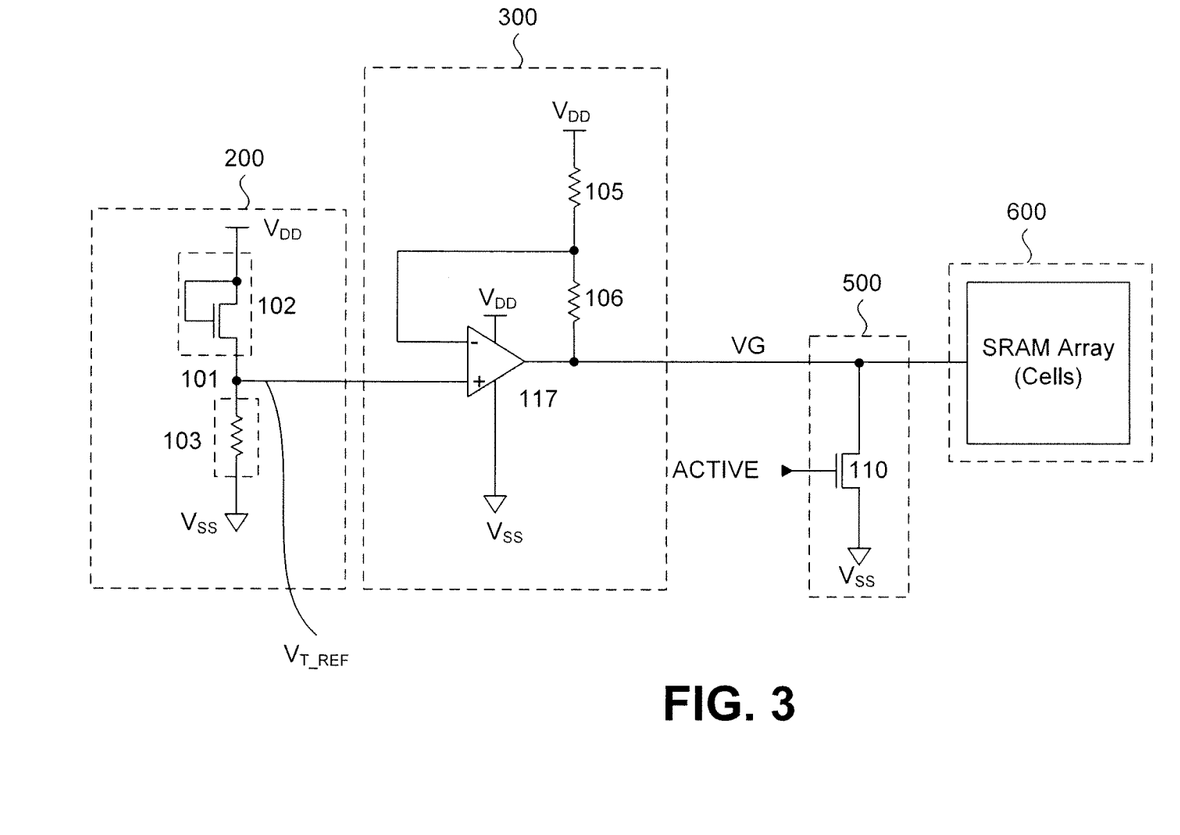
FIG. 3 is a block and circuit diagram of another embodiment of the present disclosure.

FIG. 3 is a block and circuit diagram of another embodiment of the present disclosure. In FIG. 3, the blocks 200, 500 and 600 are the same as in FIG. 2. An alternative embodiment of the multiplier circuit 300 is shown in FIG. 3 including a multiplier operational amplifier 117 with the input terminals inverted as compared to FIG. 2. The operational amplifier 104 and the multiplier transistor 107 of FIG. 2 can be seen as one larger operational amplifier 117 as in FIG. 3. As such, embodiments of the present disclosure can include an actual larger operational amplifier 117, or this larger operational amplifier can be a simplified representation of underlying circuit elements. The larger operational amplifier 117, or the underlying operational amplifier 104, can have a strong enough output drive to avoid the need for the block 400 in such embodiments. The first feedback chain element 105 is coupled between the supply voltage and the inverting input of the operational amplifier 117. The second feedback chain element 106 is coupled between the inverting input and the output of the operational amplifier 117. The non-inverting input of the operational amplifier 117 is coupled to the output of the threshold reference voltage circuit. The operational amplifier 117 outputs the virtual ground reference voltage and applies it to the node VG.

Figure 4:
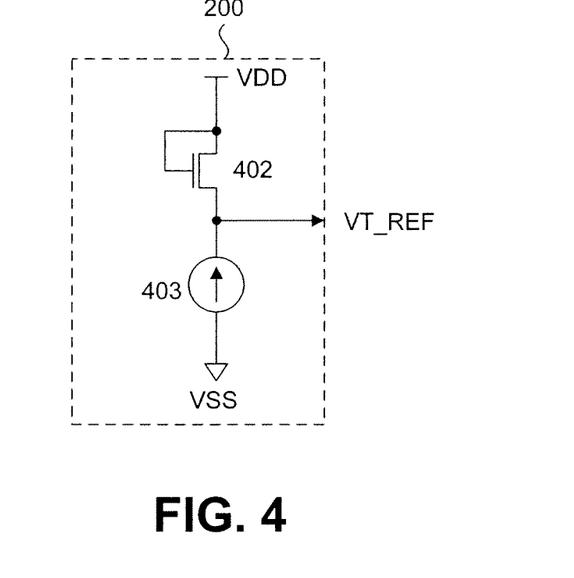
FIG. 4 is a circuit schematic of a threshold voltage reference circuit according to another embodiment of the present disclosure.

FIG. 4 is a circuit schematic of a threshold voltage reference circuit according to another embodiment of the present disclosure. In this embodiment, the threshold voltage tracking means is a transistor 402 similar to the transistor in FIG. 2. The current discharge means in FIG. 4 is a current source 403. Although the current source 403 is depicted in FIG. 4 as an ideal current source, it is to be understood that this element can comprise any current source-type circuit. The transistor 402 and current source 403 are coupled in the circuit of FIG. 4 in a similar manner as described in relation to the coupling of the threshold voltage tracking means and current discharge means in FIG. 2.

Figure 5:
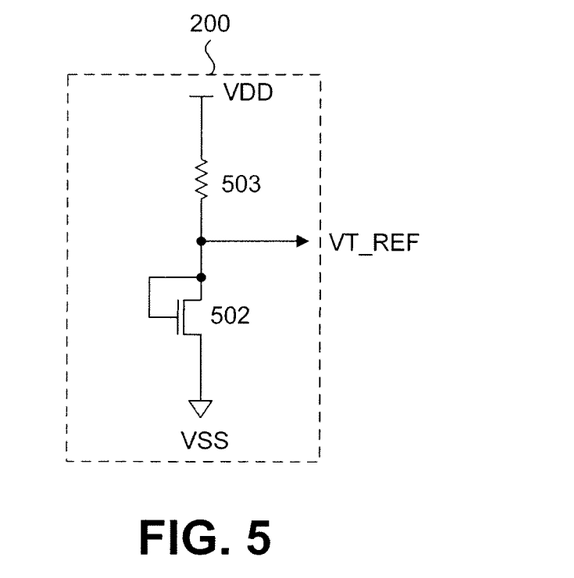
FIG. 5 is a circuit schematic of a threshold voltage reference circuit according to a further embodiment of the present disclosure.

FIG. 5 is a circuit schematic of a threshold voltage reference circuit according to a further embodiment of the present disclosure. In this embodiment, the current discharge means is coupled between the positive supply voltage and the threshold reference voltage node, and the threshold voltage tracking means is coupled between the threshold reference voltage node and the negative supply voltage. In the exemplary embodiment of FIG. 5, the current discharge means is a resistor 503 coupled to $V_{DD}$, and the threshold voltage tracking means is an n-channel transistor 502 having its gate and drain coupled to resistor 503 and its source coupled to $V_{SS}$. The threshold voltage reference circuit in FIG. 5 provides an output voltage $V_{T\_REF}$ equal to $V_{th}$.

Figure 6:
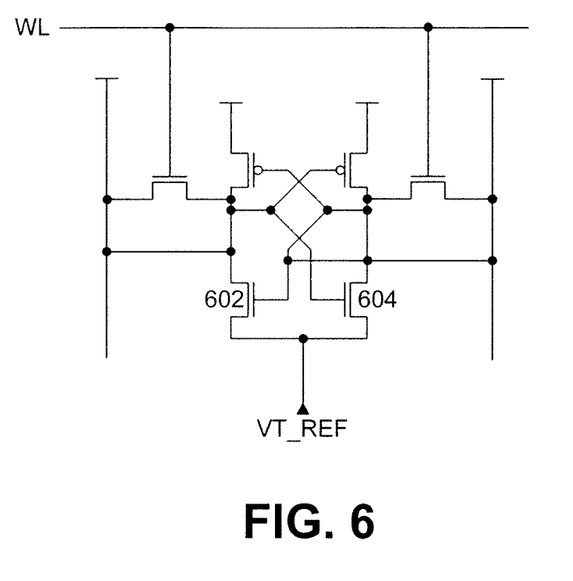
FIG. 6 illustrates a modified SRAM memory cell according to an embodiment of the present disclosure.

FIG. 6 illustrates a modified SRAM memory cell according to an embodiment of the present disclosure. This modified SRAM memory cell can be used as a threshold voltage tracking means 102 as shown in FIG. 2, in which case higher Vth tracking accuracy can be obtained. As compared with the standard cell shown in FIG. 4, the modified SRAM memory cell of FIG. 6 has been rewired such that a first cross-coupled n-channel transistor 602 has its gate connected to $V_{DD}$ and its drain connected to $V_{DD}$. A second cross-coupled n-channel transistor 604 now has its drain connected to $V_{DD}$. The source terminals of cross-coupled transistors 602 and 604 are connected to node $V_{T\_REF}$, which is connected to current discharge means 103 in FIG. 2. It is advantageous to use the memory cell of FIG. 6 as a reference device as the topology of the SRAM cell can affect the threshold voltage.

Figure 7:
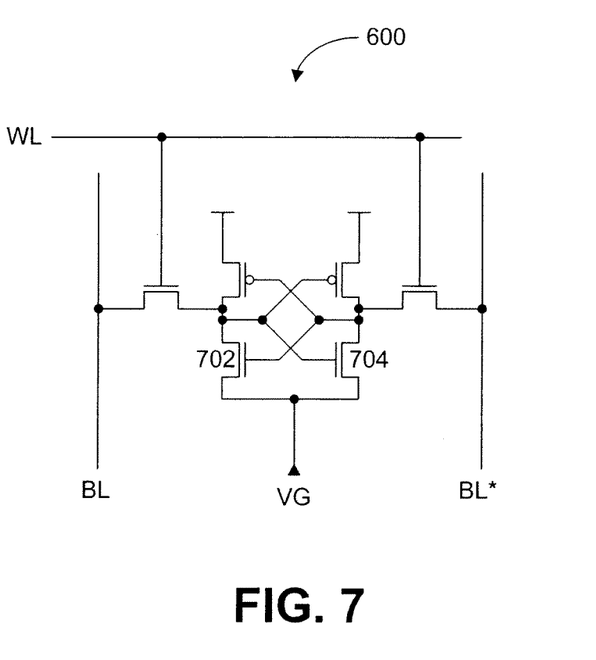
FIG. 7 is a circuit schematic of an SRAM memory cell for use in an array according to an embodiment of the present disclosure.

FIG. 7 is a circuit schematic of an SRAM memory cell used in the memory array 600. The SRAM memory cell is based on a standard 6-transistor cross coupled CMOS cell. It is noted that reference transistor 102 of FIG. 2 is substantially identical to cross-coupled transistors 702 and 704 in FIG. 7, which are n-channel transistors. The virtual ground node VG is connected to the source terminals of transistors 702 and 704.

In summary, embodiments of the present disclosure can provide improved stability over prior solutions by tracking the $V_{th}$ of a memory cell transistor, and by forcing the memory array to be in a state where all "ON" transistors in the memory array are driven by $1.5*V_{th}$. By maintaining node VG at the minimum required level to maintain stable data during a power saving mode, according to embodiments of the present disclosure leakage current can be reduced.

In an implementation, the present disclosure provides a system for maintaining a virtual ground node of an SRAM array at a data retention level, including: a multiplier circuit arranged to receive a generated threshold reference voltage and to output a virtual ground reference voltage equal to a difference between the positive supply voltage and a product of a multiplication factor and a threshold voltage of a memory cell transistor in the SRAM array; and a virtual ground leakage reduction circuit coupled to the multiplier circuit to receive the virtual ground reference voltage and maintain a virtual ground node coupled to the SRAM array at the virtual ground reference voltage.

In another implementation, the present disclosure provides a threshold reference voltage generation circuit for an SRAM array, including: a voltage divider coupled between a positive supply voltage and a negative supply voltage to generate a threshold reference voltage, the threshold reference voltage being substantially equal to a difference between the positive supply voltage and the threshold voltage of a memory cell transistor in the SRAM array.

In the above description, for purposes of explanation, numerous details have been set forth in order to provide a thorough understanding of example embodiments. However, it will be apparent to one skilled in the art that these specific details are not required in order to practice the embodiments of the present disclosure. In other instances, well-known electrical structures and circuits are shown in block diagram form in order not to obscure the embodiments of the present disclosure. For example, specific details are not provided as to whether the embodiments described herein are implemented as a software routine, hardware circuit, firmware, or a combination thereof.

The above-described embodiments of the present disclosure are intended to be examples only. Alterations, modifications and variations may be effected to the particular embodiments by those of skill in the art without departing from the scope of the disclosure, which is defined solely by the claims appended hereto.

What is claimed is:

1. A system for maintaining a virtual supply node of a static random access memory (SRAM) array at a data retention level, comprising:
   a virtual supply reference voltage generation circuit arranged to adjust a received generated threshold reference voltage to provide a virtual supply reference voltage based on the adjusted received generated threshold reference voltage; and
   a virtual supply leakage reduction circuit arranged to receive the virtual supply reference voltage, the virtual supply leakage reduction circuit being coupled to the virtual supply reference voltage generation circuit, the virtual supply leakage reduction circuit also maintaining the virtual supply node coupled to the SRAM array at the virtual supply reference voltage, the received virtual supply reference voltage being based on a threshold voltage of a memory cell transistor in the SRAM array.

2. The system of claim 1 wherein the virtual supply node comprises a virtual ground node.

3. The system of claim 1 wherein the virtual supply leakage reduction circuit comprises a virtual ground leakage reduction circuit.

4. The system of claim 1 wherein the virtual supply reference voltage comprises a virtual ground reference voltage.

5. The system of claim 4 wherein the received virtual ground reference voltage is based on the threshold voltage of a memory cell transistor in the SRAM array and a positive supply voltage.

6. The system of claim 4 wherein the virtual ground reference voltage is equal to a difference between the positive supply voltage and about one and a half times the threshold voltage of the memory cell transistor.

7. A system for maintaining a virtual supply node of a static random access memory (SRAM) array at a data retention level, comprising:
   a virtual supply leakage reduction circuit arranged to receive a virtual supply reference voltage and maintain the virtual supply node coupled to the SRAM array at the virtual supply reference voltage, the received virtual supply reference voltage being based on a threshold voltage of a memory cell transistor in the SRAM array.

8. The system of claim 7 wherein the virtual supply node comprises a virtual ground node.

9. The system of claim 7 wherein the virtual supply leakage reduction circuit comprises a virtual ground leakage reduction circuit.

10. The system of claim 7 wherein the virtual supply reference voltage comprises a virtual ground reference voltage.

11. The system of claim 10 wherein the received virtual supply reference voltage is based on the threshold voltage of a memory cell transistor in the SRAM array and a positive supply voltage.

12. The system of claim 10 wherein the virtual ground reference voltage is equal to a difference between the positive supply voltage and about one and a half times the threshold voltage of the memory cell transistor.

13. A system for maintaining a virtual supply node of a static random access memory (SRAM) array at a data retention level, comprising:
- a virtual supply reference voltage generation circuit arranged to adjust a received generated threshold reference voltage to provide a virtual supply reference voltage based on the adjusted received generated threshold reference voltage,
- the virtual supply reference voltage being used to maintain the virtual supply node coupled to the SRAM array at the virtual supply reference voltage,
- the received virtual supply reference voltage being based on a threshold voltage of a memory cell transistor in the SRAM array.

14. The system of claim 13 wherein the virtual supply node comprises a virtual ground node.

15. The system of claim 13 wherein the virtual supply leakage reduction circuit comprises a virtual ground leakage reduction circuit.

16. The system of claim 13 wherein the virtual supply reference voltage comprises a virtual ground reference voltage.

17. The system of claim 16 wherein the received virtual supply reference voltage is based on the threshold voltage of a memory cell transistor in the SRAM array and a positive supply voltage.

18. The system of claim 16 wherein the virtual ground reference voltage is equal to a difference between the positive supply voltage and about one and a half times the threshold voltage of the memory cell transistor.

\* \* \* \* \*